United States Patent
Tosa

(10) Patent No.: US 11,340,446 B2
(45) Date of Patent: May 24, 2022

(54) ACTUATOR

(71) Applicant: THE NIPPON SIGNAL CO., LTD., Tokyo (JP)

(72) Inventor: Hiroshi Tosa, Kuki (JP)

(73) Assignee: THE NIPPON SIGNAL CO., LTD., Tokyo (JP)

( * ) Notice: Subject to any disclaimer, the term of this patent is extended or adjusted under 35 U.S.C. 154(b) by 130 days.

(21) Appl. No.: 16/650,913

(22) PCT Filed: Sep. 26, 2018

(86) PCT No.: PCT/JP2018/035717
§ 371 (c)(1),
(2) Date: Mar. 26, 2020

(87) PCT Pub. No.: WO2019/065746
PCT Pub. Date: Apr. 4, 2019

(65) Prior Publication Data
US 2020/0271919 A1    Aug. 27, 2020

(30) Foreign Application Priority Data

Sep. 27, 2017  (JP) .............................. JP2017-187237

(51) Int. Cl.
*G02B 26/08* (2006.01)
*G02B 26/10* (2006.01)
*H02K 33/18* (2006.01)

(52) U.S. Cl.
CPC ......... *G02B 26/085* (2013.01); *G02B 26/101* (2013.01); *H02K 33/18* (2013.01)

(58) Field of Classification Search
CPC .. G02B 26/085; G02B 26/101; G02B 26/105; H02K 33/18; B81B 3/00
(Continued)

(56) References Cited

U.S. PATENT DOCUMENTS 10,103,613 B2 * 10/2018 Sadaharu .............. G02B 26/101
2006/0226734 A1  10/2006 Yoda
(Continued)

FOREIGN PATENT DOCUMENTS

EP     2 040 105 A1   3/2009
JP     2722314 B2     3/1998
(Continued)

OTHER PUBLICATIONS

Extended European Search Report issued in corresponding European Patent No. 18862832.5 dated Jun. 4, 2021.

*Primary Examiner* — Euncha P Cherry
(74) *Attorney, Agent, or Firm* — Foley & Lardner LLP

(57) ABSTRACT

An actuator according to the present invention includes a support 20 that supports a driven unit 10, and outer axis driver units DSa, DSb that are separate and independent from the support 20 and configured to rotate the support 20. This configuration allows providing a sufficient rotational driving force around the outer, second axis AX2 by reducing size and weight of the related rotatable components and thus by reducing rotational moments thereof, and also allows increasing the resonance frequency of the support 20. As such, the actuator according to this embodiment provides a high-performance drive operation such as a raster scanning operation, for example.

5 Claims, 11 Drawing Sheets

(58) Field of Classification Search
USPC ...................................................... 359/199.3
See application file for complete search history.

(56) References Cited

U.S. PATENT DOCUMENTS

| | | |
|---|---|---|
| 2008/0238592 A1 | 10/2008 | Ko et al. |
| 2008/0285103 A1 | 11/2008 | Mizumoto |
| 2009/0180167 A1 | 7/2009 | Tani |
| 2015/0097449 A1 | 4/2015 | Suzuki |
| 2015/0277107 A1 | 10/2015 | Aimono |
| 2015/0357897 A1 | 12/2015 | Muchow |
| 2016/0033761 A1 | 2/2016 | Murayama |
| 2016/0122178 A1 | 5/2016 | Fujimoto |
| 2017/0153443 A1 | 6/2017 | Carminati |

FOREIGN PATENT DOCUMENTS

| | | |
|---|---|---|
| JP | 2008-310295 A | 12/2008 |
| JP | 2009-169089 A | 7/2009 |
| JP | 2009-216789 A | 9/2009 |
| JP | 2016-033593 A | 3/2016 |
| JP | 2016-040633 A | 3/2016 |
| JP | 2016-048386 A | 4/2016 |
| WO | WO-2014/192123 A1 | 12/2014 |

\* cited by examiner

ACTUATOR

TECHNICAL FIELD

The present invention relates to an actuator that may be used as a driving actuator for a micro-electro-mechanical system (MEMS) device, for example.

BACKGROUND ART

A known example of driving actuators for MEMS devices is configured to provide biaxial drive to rotate a driven unit, such as a mirror, and includes an inner movable unit including a driver coil and the driven unit, and an outer movable unit including a driver coil and disposed so as to surround the inner movable unit (see Patent Documents 1 and 2).

However, the technique as disclosed in Patent Documents 1 and 2 requires each of the inner movable unit and the outer movable unit to have a driver coil, and thus tends to increase the size and weight of the actuator. This tendency is particularly evident in the outer movable unit for low-speed axis drive, since the outer movable unit is configured both to support the inner movable unit and to use the driver coil therein to rotate itself. Accordingly, depending on the design of the actuator, the conventional technique may provide only an insufficient driving force for non-resonant drive operation from the outer movable unit, and may not permit sufficiently increasing the resonance frequency of the outer movable unit. Thus, according to the conventional technique, it may be difficult to perform raster scanning operation, for example. Furthermore, the conventional technique may allow generation of unwanted vibrations that may cause malfunction of the actuator, for example. In addition, according to the conventional technique, distortion of the outer movable unit may adversely affect the operation of the actuator.

REFERENCE DOCUMENT LIST

Patent Documents

Patent Document 1: JP 2009-216789 A
Patent Document 2: JP 2722314 B

SUMMARY OF THE INVENTION

Problem to be Solved by the Invention

The present invention has been made in view of the above, and has an object to provide an actuator having improved driving force production capability and an improved resonance frequency, thus enabling a high-performance drive operation.

Means for Solving the Problem

To achieve the above object, an actuator according to the present invention includes a support, an outer axis driver unit, and an inner axis driver unit. The support supports a driven unit disposed at an inner position of the support by connecting to the driven unit via an inner beam extending along a first axis. The outer axis driver unit is provided independent from the support and connecting to the support via an outer beam extending along a second axis perpendicular to the first axis, and is configured to rotate the support around the second axis. The inner axis driver unit is configured to rotate the driven unit around the first axis.

Effects of the Invention

The actuator includes the support that supports the driven unit, and the outer axis driver unit that is separate and independent from the support and is configured to rotate the support, in place of a conventional outer movable unit that has two functions to support the driven unit and to use the coil therein to rotate itself. This configuration allows providing a sufficient rotational driving force around the outer, second axis by reducing size and weight of the related rotatable components, and thus, by reducing rotational moments thereof, and also allows increasing the resonance frequency of the support. As such, the actuator provides a high-performance drive operation such as a raster scanning operation, for example.

According to a specific aspect of the present invention, the outer axis driver unit is a low-speed axis driver unit and the inner axis driver unit is a high-speed axis driver unit, so that the outer axis driver unit and the inner axis driver unit are configured to provide biaxial drive that causes the driven unit to perform raster scanning. This enables raster scanning with a simple drive control.

According to another aspect of the present invention, a plurality of outer axis driver units are provided. This provides an improved driving force performance for rotation around the second axis.

According to yet another aspect of the present invention, the outer axis driver units are a pair of outer axis driver units disposed at opposite ends of the support along the second axis. This enables transmitting driving forces for rotation around the second axis to the driven unit from both the opposite ends. Furthermore, providing a pair of outer axis driver units allows a more stabilized movement of the driven unit.

According to yet another aspect of the present invention, the inner axis driver unit includes a first coil unit configured to rotate around the first axis, and a first magnetic field applying unit configured to generate a magnetic field in a single direction so as to apply, to the first coil unit, a rotational force that rotates the first coil unit around the first axis, and the outer axis driver unit includes a second coil unit configured to rotate around the second axis, and a second magnetic field applying unit configured to generate a magnetic field in a single direction so as to apply, to the second coil unit, a rotational force that rotates the second coil unit around the second axis. This allows each of the magnetic field applying units to have a simple and small structure.

According to yet another aspect of the present invention, the natural frequency of the support is, higher than the torsional resonance frequency of the driven unit. This prevents or reduces the support from generating unwanted vibrations in the driven unit.

MODES FOR CARRYING OUT THE INVENTION

First Embodiment

Figure 1:
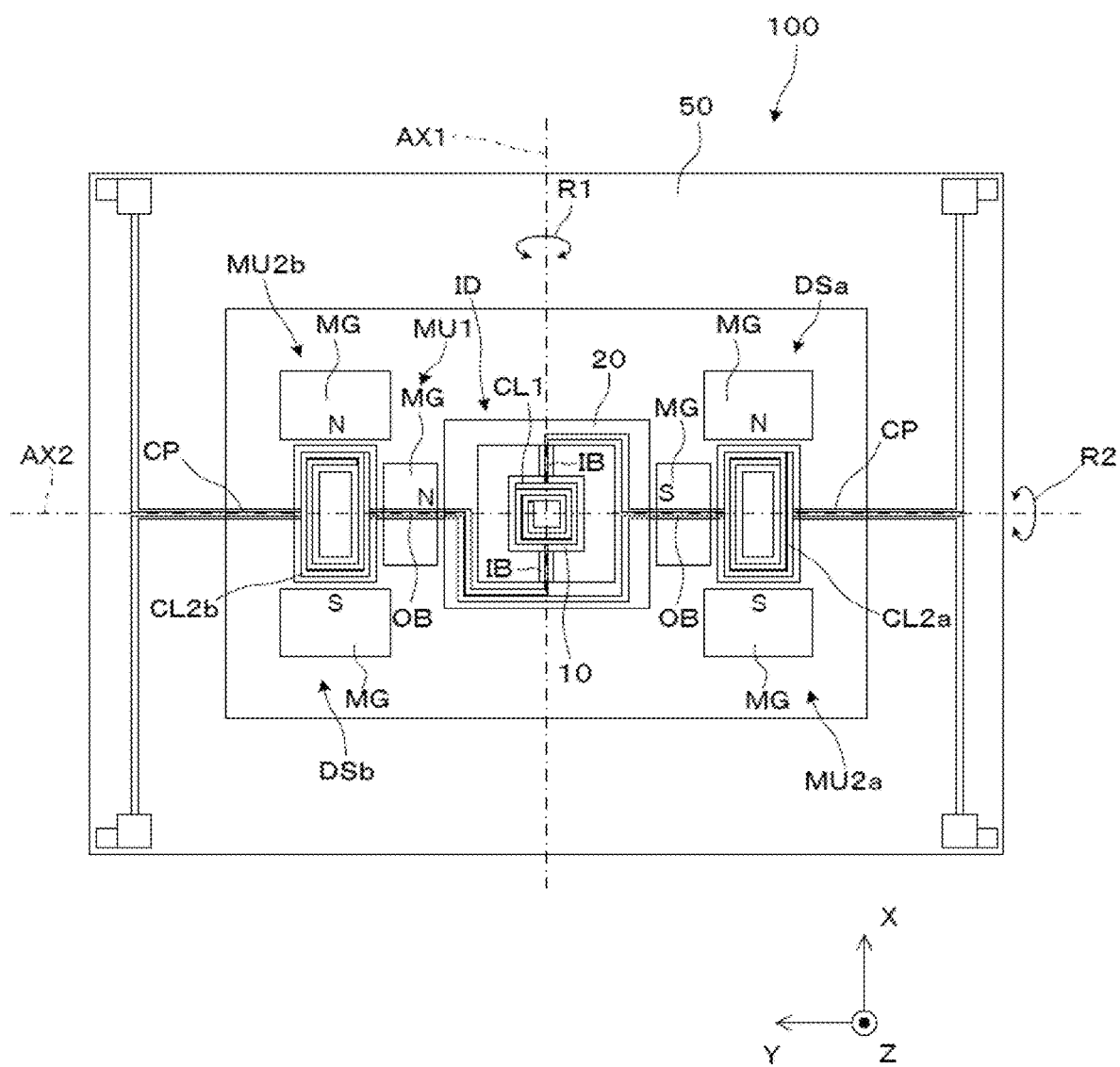
FIG. 1 is a diagram for illustrating an actuator according to a first embodiment.

Hereinafter, an example of an actuator according to a first embodiment will be described with reference to FIG. 1 and other drawings. FIG. 1 is a block diagram for illustrating an example of the actuator according to this embodiment. An actuator 100 according to an aspect of this embodiment is applicable to an optical scanning device in a ranging image device, for example. The ranging image device is configured to scan an object with pulsed light such as laser pulses so as to acquire ranging image data of the object. Furthermore, the actuator 100 is also applicable to a display device configured to emit pulsed light synchronized in timing with optical scanning so as to project an image on a screen.

As shown in FIG. 1, the actuator 100 includes a driven unit 10, an inner axis driver unit ID, a support 20, a pair of outer axis driver units DSa, DSb, and a fixing unit 50, for example. The inner axis driver unit ID is configured to rotate the driven unit 10. The support 20 supports the driven unit 10. The outer axis driver units DSa, DSb are disposed at the opposite ends of the support 20 and configured to rotate the support 20. The fixing unit 50, for fixing the entire body of the actuator 100, is frame-shaped and connected to both the outer axis driver units DSa, DSb. The actuator 100 further includes inner beams IB, IB and outer beams OB, OB. The inner beams IB, IB connect the driven unit 10 with the support 20. The outer beams OB. OB connect the outer axis driver units DSa, DSb with the support 20. Furthermore, the inner axis driver unit ID, which serves as a rotational drive source unit for causing rotation, includes a first coil unit CL1 and a first magnetic field applying unit MU1. The first coil unit CL1 serves as a driving part. The first magnetic field applying unit MU1 is configured to apply a magnetic field to the first coil unit CL1. Similarly, each of the outer axis driver units DSa, DSb serves as a rotational drive source unit for causing rotation. The outer axis driver unit DSa includes a second coil unit CL2a and a second magnetic field applying unit MU2a, and the outer axis driver unit DSb includes a second coil unit CL2b and a second magnetic field applying unit MU2b. Each of the second coil units CL2a, CL2b serves as a driving part. The second magnetic field applying units MU2a, MU2b are configured to apply magnetic fields to the second coil units CL2a, CL2b, respectively.

In the entire body of the actuator 100 shown in a plan view of FIG. 1 a plane defined by the fixing unit 50, which serves as an outer frame, is used herein as a reference plane (horizontal plane). As used herein, "X direction" refers to the up-down direction in the reference plane in FIG. 1, and "Y direction" refers to the left-right direction in the reference plane in FIG. 1, which is perpendicular to the X direction. The frame-shaped fixing unit 50 defines a rectangular with two sides extending in the X direction and two sides extending in the Y direction. Furthermore, as used herein, "Z direction" refers to a direction perpendicular to both the X direction and the Y direction, i.e., refers to a direction perpendicular to the reference plane.

The actuator 100 is configured as above to transmit excitation forces generated by the inner axis driver unit ID and the outer axis driver units DSa, DSb to the driven unit 10 so as to rotate the driven unit 10 around two different axes; that is, a first axis AX1 extending in the X direction and a second axis AX2 extending in the Y direction, which is perpendicular to the X direction.

In the example as shown, the support 20 supports the driven unit 10 disposed at an inner position of the support by connecting to the driven unit 10 via the inner beams IB, IB extending along the first axis AX1, which is parallel to the X direction. In addition, as a rotational drive source unit for causing rotation, the inner axis driver unit ID provides a driving force to the driven unit 10 so as to rotate it around the first axis AX1. This configuration allows the driven unit 10 to rotate around the first axis AX1 in the directions indicated by arrow R1.

Furthermore, in the example as shown, the outer axis driver units DSa, DSb support the support 20 by connecting to the support 20 via the outer beams OB, OB extending along the second axis AX2 which is perpendicular to the first axis AX1 extending in the X direction in the XY plane, that is, the second axis AX2 which, is parallel to the Y direction. The outer axis driver units DSa, DSb and the support 20 are disposed along the second axis AX2. The pair of outer axis driver units DSa, DSb are further connected to the fixing unit 50 by means, respectively, of a pair of rod-shaped connecting members CP, CP disposed at positions close to the periphery of the fixing unit 50. Each of the pair of outer axis driver units DSa, DSb, the support 20, and the driven unit 10 has a shape that is symmetrical about the second axis AX2. This configuration allows the second coil units CL2a, CL2b, the support 20, and the driven unit 10 supported by the support 20 to rotate around the second axis AX2 in the directions indicated by arrow R2.

The actuator 100 is configured as above to cause the driven unit 10 to perform optical scanning by rotating the driven unit 10 around these two different axes; that is, the first axis AX1 and the second axis AX2.

Hereinafter, the components of the actuator 100 will be described more specifically.

The driven unit 10 has a flat surface portion (an elliptical surface portion in the example as shown). For example, the flat surface portion may be partially or entirely formed as a movable mirror surface (movable light reflecting surface). When the driven unit 10 is driven to biaxially rotate as described above, the driven unit 10 performs optical scanning while reflecting incoming light on the mirror surface. The driven unit 10 is disposed at an inner position of the support 20 and connected to the support 20 via the inner beams IB, IB, so that the driven unit 10 is supported to be rotatable around the inner beams IB, IB.

As described above, the inner axis driver unit ID, which serves as the rotational drive source unit for rotating the driven unit 10, includes the first coil unit CL1 and the first magnetic field applying unit MU1. With this configuration, the inner axis driver unit ID applies a force to cause axial rotation of the driven unit 10, which is rotatably supported by the support 20.

The first coil unit CL1 in the inner axis driver unit ID is formed as a rectangular loop of a wire of a relatively conductive material such as gold or copper. Here, the first coil unit CL1 is disposed on the back side of the mirror surface (light reflecting surface) of the driven unit 10, for example. The first coil unit CL1 is disposed such that two of the four sides of its rectangular loop extend in the X direction, thereby being configured such that current (AC current) flowing therethrough in the X direction crosses the direction of the magnetic field generated by the first magnetic field applying unit MU1. Thus, during operation, the first coil unit CL1 receives Lorentz forces from the first magnetic field applying unit MU1, and rotates the driven unit 10 around the first axis, AX1 with a deflection angle and a speed appropriately adjusted in accordance with the required scanning range and speed.

In the inner axis driver unit ID, the first, magnetic field applying unit MU1 may be formed by combining multiple (two, in the example as shown) permanent magnets MG, MG which are disposed to sandwich the first coil unit CL1, for example, so as to be configured to apply a magnetic field to the first coil unit CL1 as described above. Note that even in a configuration in which one or more of the permanent magnets MG, MG are substituted by a yoke, the first magnetic field applying unit MU1 is able to apply a magnetic field. In the example as shown, the permanent magnets MG, MG are appropriately combined and installed so that the first magnetic field applying unit MU1 generates magnetic fields in the −Y direction.

When currents flow through the first coil unit CL1 in the ±X directions across the magnetic field generated in the Y direction by the first magnetic field applying unit MU1, the first coil unit CL1 receives forces in the ±Z directions (according to Fleming's left-hand rule). Understood differently, the first magnetic field applying unit MU1 generates a magnetic field in a single direction (the −Y direction) so as to cause a rotational force that rotates the first coil unit CL1 around the first axis AX1.

As described above, when a rotationally driving force or a rotation torque corresponding to the excitation force generated in the first coil unit CL1 of the inner axis driver unit ID is received by (transmitted to) the driven unit 10, the driven unit 10 rotates around the first axis AX1.

On the other hand, the support 20 supports the driven unit 10 disposed at an inner position of the support by means of the inner beams IB, IB, and is connected to the pair of outer axis driver units DSa, DSb by means, respectively, of the outer beams OB, OB, as described above.

Each of the second coil units CL2a, CL2b in the outer axis driver units DSa, DSb is formed as a rectangular loop of a wire of a relatively conductive material such as gold or copper that is wound around a frame. Each second coil unit CL2a, CL2b is disposed such that two of the four sides of its rectangular loop extend in the Y direction, thereby being configured such that current (AC current) flowing therethrough in the Y direction crosses the direction of the magnetic field generated by the second magnetic field applying unit MU2a, MU2b. Thus, during operation, the second coil units CL2a, CL2b receive Lorentz forces respectively from the second magnetic field applying unit MU2a, MU2b, and rotate the support 20 so that the driven unit 10 rotates around the second axis AX2 with a deflection angle and a speed appropriately adjusted in accordance with the required scanning range and speed.

In the outer axis driver units DSa, DSb, the second magnetic field applying units MU2a, MU2b may each be formed by combining multiple (two, in the example as shown) permanent magnets MG, MG which are disposed to sandwich the second coil unit CL2a, CL2b, for example, so as to be configured to apply magnetic fields to the second coil units CL2a. CL2b as described above. In the example as shown, the permanent magnets MG, MG are appropriately combined and installed so that the second magnetic field applying units MU2a, MU2b generate magnetic fields in the −X direction.

When currents flow through the second coil unit CL2a, CL2b in the ±Y directions across the magnetic field generated in the X direction by the second magnetic field applying unit MU2a, MU2b, the second coil unit CL2a, CL2b receives forces in the ±Z directions (according to Fleming's left-hand rule). Understood differently, the second magnetic field applying units MU2a, MU2b generate magnetic fields in a single direction (the −X direction) so as to cause rotational forces that rotate the second coil units CL2a, CL2b around the second axis AX2, respectively.

As described above, the support 20 works as a movable frame configured to rotate around the second axis AX2 when a rotationally driving force or a rotation torque corresponding to the excitation forces generated in the second coil units CL2a, CL2b of the pair of outer axis driver units DSa, DSb is received by (transmitted to) the support 20 via the outer beams OB. Furthermore, when the support 20 rotates around the second axis AX2, the driven unit 10 also rotates around the second axis AX2 since the driven unit 10 is rotatably connected to the support 20 by means of the inner beams IB, IB.

The outer beams OB are elastic members made of a resin, a metal such as silicon, a copper alloy, an iron-based alloy, or another material. Like the outer beams OB, the inner beams IB are also elastic members. However, the inner beams IB are configured to be able to respond to vibrations at higher frequencies than the outer beams OB, in particular.

Each of the coil units CL1, CL2a, CL2b is supplied with a control current from a power source (not shown). To enable this, wiring is provided as shown. As such, the inner beams IB and the outer beams OB are each required to have a sufficient width (thickness) to accommodate such wiring in addition to sufficient strength and resistance performance to withstand the above rotations (or resultant twists). Each control current is an AC current including a signal component with a frequency corresponding to a drive frequency for the driven unit 10.

Figure 2:
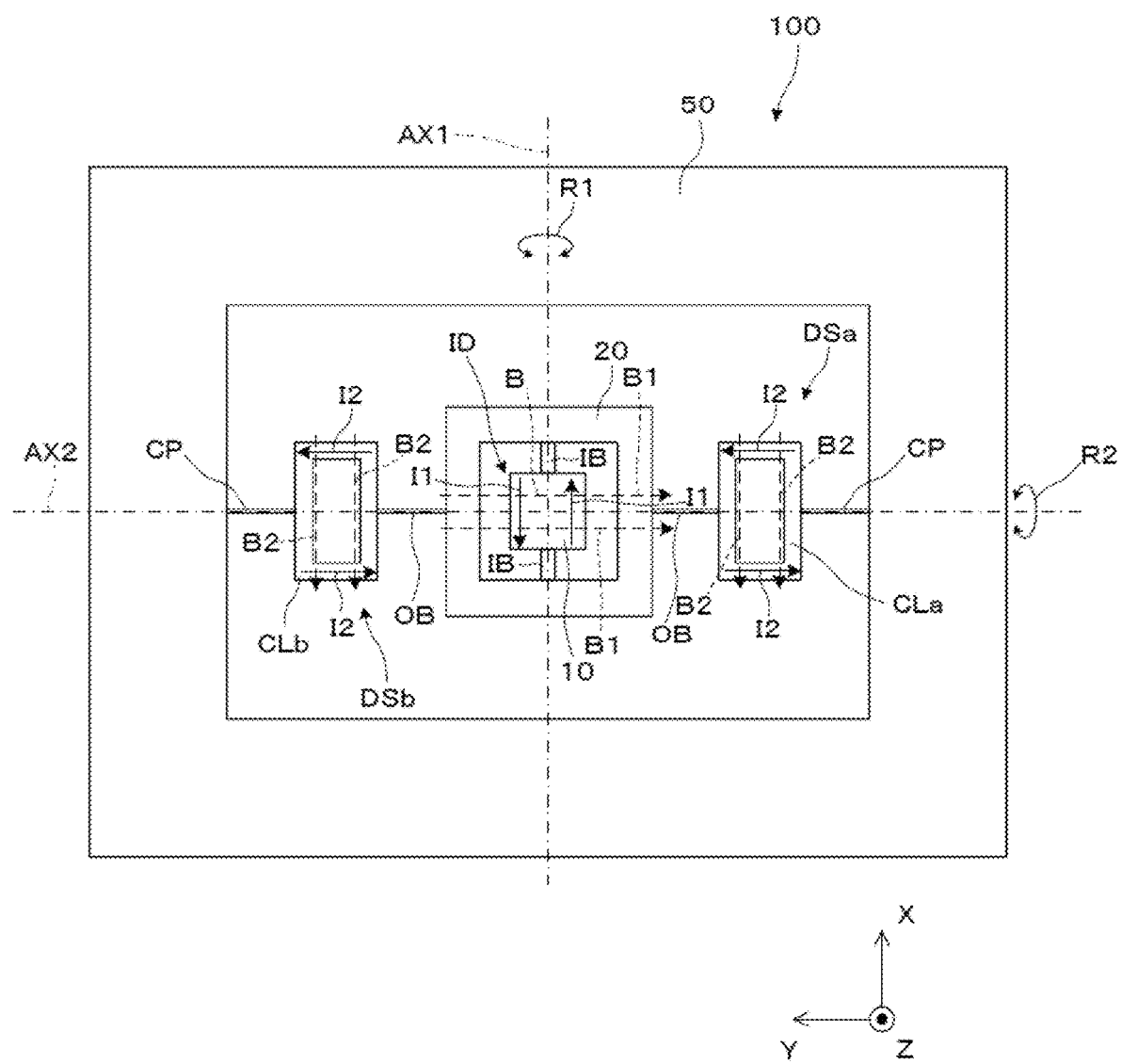
FIG. 2 is a schematic diagram for illustrating an operation of the actuator.

Hereinafter, with reference to the schematic diagram of FIG. 2, an example of the operation of rotationally driving the driven unit 10 in the actuator 100 having the above configuration will be described. In this example, it is assumed that the signal component included in a control current I1 supplied to the coil unit CL1 and the signal component included in a control current I2 supplied to the coil units CL2a, CL2b differ in frequency, that is, have two different frequencies corresponding to the drive frequencies of the driven unit 10 (a low-speed drive signal and a high-speed drive signal). Specifically, the high-speed drive is performed for the rotation around the first axis AX1 extending in the X direction, i.e., the rotation caused by the inner axis driver unit ID which includes the first coil unit CL1. On the other hand, the low-speed drive is performed for the rotation around the second axis AX2 extending in the Y direction, i.e., the rotation caused by the outer axis driver units DSa, DSb which include the second coil units CL2a, CL2b. In other words, in this example, the driven unit 10 is driven around the first axis AX1 by vibrations generated to have a drive frequency higher than the drive frequency for the rotational force that causes rotation around the second axis AX2.

The low-speed drive signal has a frequency that causes non-resonant drive (forced drive). On the other hand, the high-speed drive signal has a frequency equal to the natural frequency (resonance frequency) of the driven unit 10, and thus, causes resonant drive. The actuator 100 rotationally drives the driven unit 10 by applying vibrations to the driven unit 10 using these drive signals, i.e., the low-speed drive signal and the high-speed drive signal.

First, the rotational movement around the first axis AX1, which extends in the X direction, will be described. Here, the control current I1 has a frequency of the high-speed drive signal, which is equal to the resonance frequency of the driven unit 10. Thus, when the control current I1 flows across a magnetic field B1 that is generated in the Y direction in the inner axis driver unit ID, a Lorentz force is generated therein and causes resonant rotation of the driven unit 10. In other words, by using a frequency suitable for the resonant drive of the driven unit 10 as the frequency for high-speed drive, rotation of the driven unit 10 around the first axis AX1 is enabled. During such rotation, the inner beams IB function as torsion bars (springs for rotation) following the rotation of the driven unit 10 according to the high-speed drive signal.

Next, the rotational movement around the second axis AX2, which extends in the Y direction, will be described. When the control current I2, which has a frequency of the low-speed drive signal, flows across a magnetic field B2 that is generated in the X direction in the outer axis driver units DSa, DSb, Lorentz forces are generated therein and forcingly rotate the support 20 around the second axis AX2. The outer beams OB are able to follow this rotational movement according to the low-speed drive. That is, during such rotation, the outer beams OB maintain their rigid shapes and transmit to the support 20 and eventually to the driven unit 10, the rotational movement caused by the rotational forces received from the second coil units CL2*a*, CL2*b*, thereby rotating the support 20 and eventually the driven unit 10. In other words, the driven unit 10 as a mirror rotates around the second axis AX2 extending in the Y direction by using the outer beams OB as torsion bars (springs for rotation).

As described above, the above configuration according to this embodiment enables biaxial drive using the high-speed drive by the inner axis driver unit ID to cause the rotational movement around the first axis AX1 and using the low-speed drive by the outer axis driver units DSa, DSb to cause the rotational movement around the second axis AX2; that is, using the first axis AX1 as a high-speed axis (axis driven by the high-speed axis driver unit) and using the second axis AX2 as a low-speed axis (axis driven by the low-speed axis driver unit).

Figure 3A:
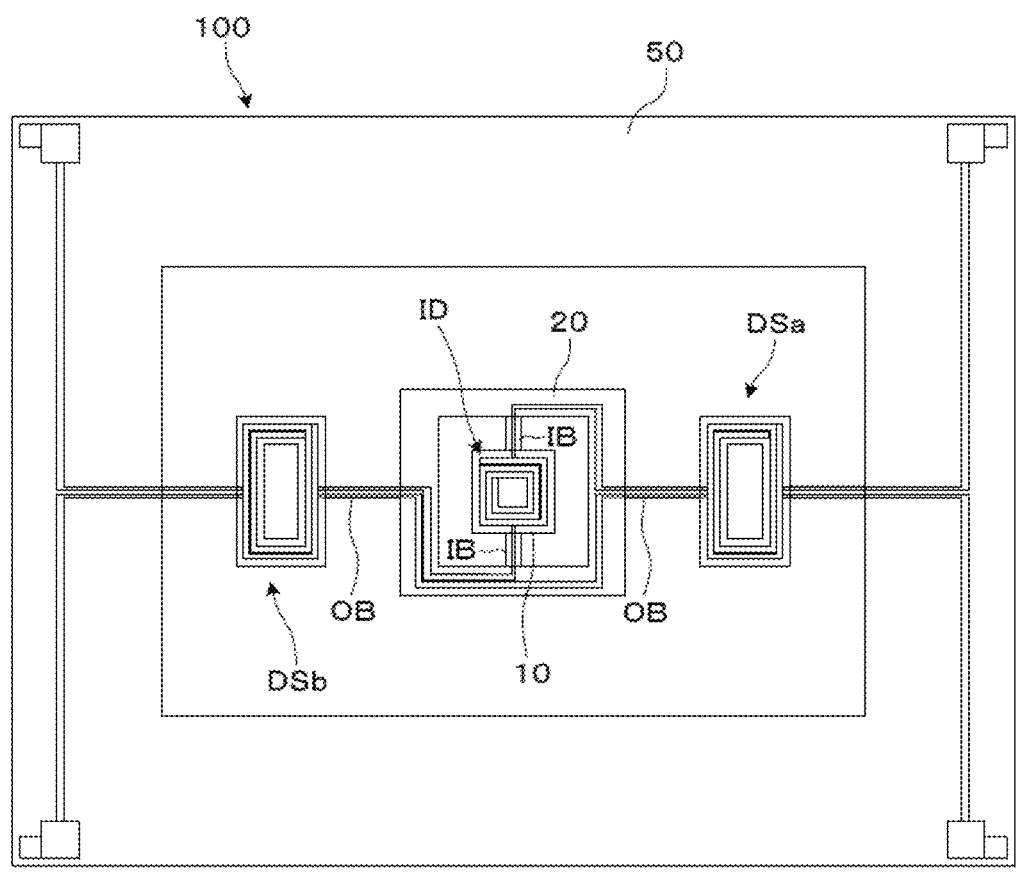
FIG. 3A is a schematic diagram of the actuator according to the first embodiment, showing only movable components thereof.
Figure 3B:
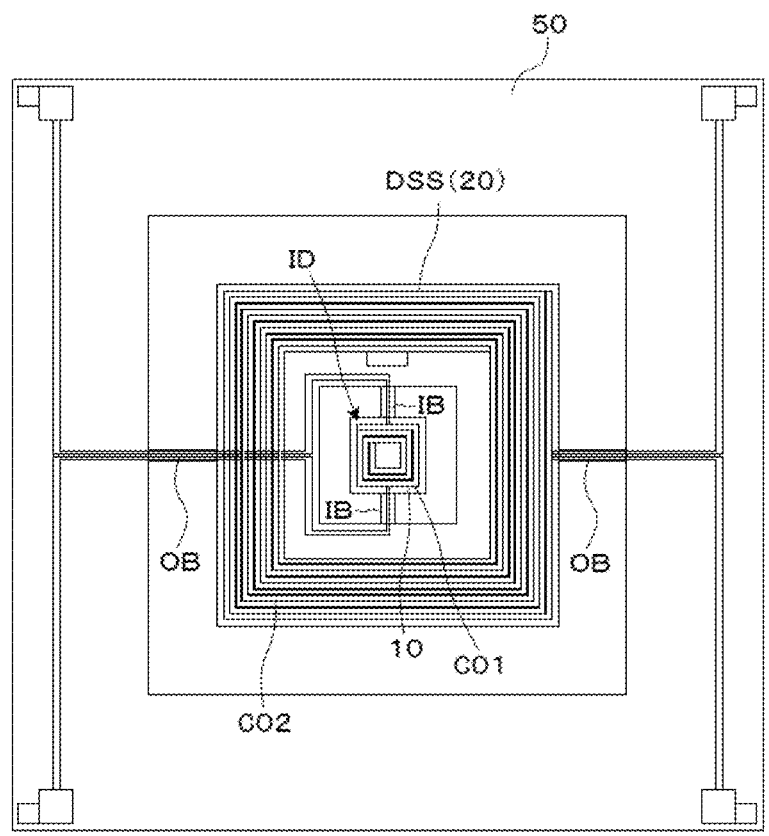
FIG. 3B is a diagram for comparison with FIG. 3A and shows one of the conventional examples as a comparative example.

Hereinafter, with reference to FIGS. 3A and 3B, some features of the above configuration will be described in comparison with a conventional example. FIG. 3A is a schematic diagram of the actuator 100 shown in FIG. 1, showing only movable components thereof, but, not showing the magnetic field applying units MU1, MU2*a*, MU2*b*. FIG. 3B is a diagram for comparison with FIG. 3A and shows one of the conventional examples as a comparative example. That is, for the purpose of comparison with FIG. 3A, FIG. 3B shows only movable components of the actuator according to the conventional example, but does not show the magnetic field applying units, as in FIG. 3A. To facilitate comparison, the magnifications of FIGS. 3A and 3B are adjusted such that the driven units 10 are shown at the same size. In the comparative example shown in FIG. 3B, among the rotational drive source units for causing rotation, the rotational drive source unit for causing outer axis rotation, i.e., for causing low-speed rotation, is formed of a single outer axis driver unit DSS. Furthermore, in the comparative example, the outer axis driver unit DSS has an additional function to serve as the support 20 that supports the driven unit 10. That is, in the comparative example, the outer axis driver unit DSS is configured both to support the driven unit 10, which is an inner movable unit, and to use the driver coil therein to rotate itself. In this regard, the actuator according to the comparative example differs from the actuator 100 according to this embodiment. Accordingly, the outer axis driver unit DSS functioning also as the support 20 of the comparative example shown in FIG. 3B is larger and heavier than the support 20 according to this embodiment shown in FIG. 3A. For example, the support 20 of FIG. 3A may be formed in a square approximately 6 mm on a side, whereas the outer axis driver unit DSS of FIG. 3B may be formed in a square approximately 9 mm on a side. This is because the outer axis driver unit DSS has to have a certain inner space to accommodate, for example, the coil units CO1, CO2 as driving parts. The outer axis driver unit DSS is heavier for the same reason.

Due to the above difference in configuration from the comparative example, this embodiment allows increasing the natural frequency of the support 20 (corresponding to the outer axis driver unit DSS in the conventional example) as compared to the comparative example, in particular. As is clear from the configuration of the above conventional example, a typical drive control of a conventional actuator provides only an insufficient low-speed axis driving force for non-resonant drive operation, and furthermore, such a conventional actuator does not permit increasing the resonance frequency of components for low-speed axis drive. Thus, according to the conventional technique, it may be difficult to perform raster scanning operation, for example. Furthermore, due to a low resonance frequency of the low-speed axis drive related member, an actuator according to the conventional technique may allow generation of unwanted vibrations that may cause malfunction of the actuator, for example. In addition, according to the conventional technique, distortion of the outer (low-speed axis drive related) member may adversely affect the operation of the actuator. Furthermore, the shape of this outer member is limited by its functionality to receive Lorentz forces for driving.

In contrast, in this embodiment, the outer axis driver units DSa, DSb or the second coil units CL2*a*, CL2*b* are provided as members for causing rotation around the second axis AX2, which is a low-speed axis (provided to constitute the driver unit for low-speed axis drive), and the support 20 is provided, as a member supporting the driven unit 10 (provided to constitute the movable unit for low-speed axis drive). In other words, in this embodiment, the two functions of the conventional outer axis driver unit DSS are allocated to the independent separate sections. Thereby, this embodiment allows greater flexibility in designing the movable unit for low-speed axis drive. Thus, this embodiment makes it possible to increase the driving force and the resonance frequency of the movable unit, and thus allows for a high-performance drive operation of the actuator that ensures elimination or reduction of the above problems.

Hereinafter, with reference to FIG. 4, the effect of reducing unwanted vibrations according to this embodiment will be described. This effect is one of the effects provided by increasing, as compared to conventional techniques, the resonance frequency of the low-speed axis drive related member, i.e., of the support 20 (which corresponds to the outer axis driver unit DSS in the conventional example of FIG. 3B).

Figure 4:
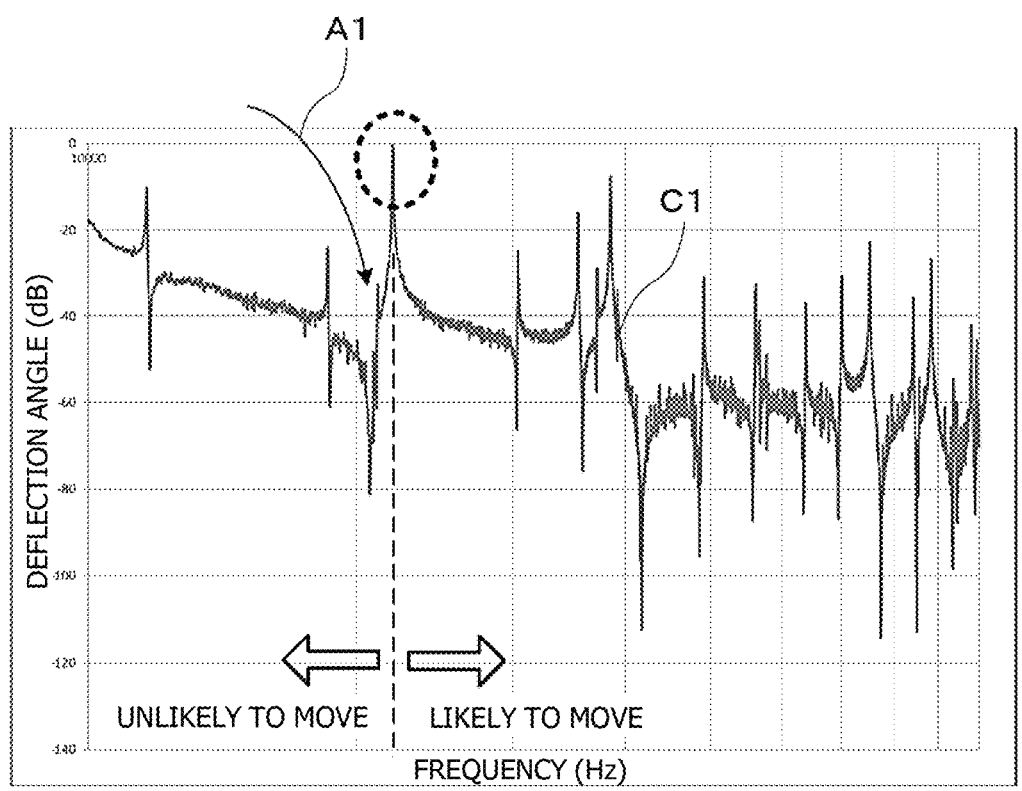
FIG. 4 is a Bode diagram of movement measurements of a driven unit.

FIG. 4 is a Bode diagram of movement measurements of the driven unit 10. In the graph of FIG. 4, the abscissa represents the frequency and the ordinate represents the deflection angle. Note that although, as indicated by curve C1 in FIG. 4, there are many frequencies (torsional resonance frequencies) at which the deflection angle increases, it is assumed herein that the frequency and deflection angle indicated by the dashed line and circle in FIG. 4 are the designed and desired torsional resonance frequency and deflection angle of the driven unit 10 to be caused by the inner axis driver unit ID for high-speed axis drive. In this example, frequencies higher than the designed and desired torsional resonance frequency cause vibrations less likely to move the driven unit 10, thus having little effect on the intended operation thereof. On the other hand, frequencies lower than the designed and desired torsional resonance frequency cause vibrations more likely to move the driven unit 10, i.e., may cause unwanted vibrations that hinder the intended movement of the driven unit 10.

For example, the natural frequency of the conventional outer axis driver unit DSS (see FIG. 3B) approximately takes a value indicated by arrow A1 of FIG. 4, which is lower than the designed and desired torsional resonance frequency of the driven unit 10. Furthermore, increasing the natural frequency of the conventional outer axis driver unit DSS is not permitted. Thus, unwanted vibrations that adversely affect the operation of the driven unit 10 may be generated in the outer axis driver unit DSS. To avoid such a situation, in this embodiment, the support 20, which corresponds to the conventional outer axis driver unit DSS, is designed to have a higher natural frequency than conventionally.

From the viewpoint of the relationship of the support 20 and the inner beams IB, IB that connect the support 20 with the driven unit 10, if the support 20 for the outer axis driver unit DSS) does not have sufficient strength, it may damp the movement of the inner beams IB, IB. To prevent such a situation, the support 20 inherently needs to have at least a certain strength. In addition, it is preferable to design the support 20 to also have a high natural frequency in consideration of the designed and desired torsional resonance frequency as described above. In this regard, it is known that the support 20 (or the outer axis driver unit DSS) having a natural frequency of 1/N (N is an integer) of the designed and desired torsional resonance frequency of the driven unit 10 will excite unwanted vibrations in the driven unit 10, in particular. In consideration of this, the support 20 according to this embodiment is designed to have a higher natural frequency than the designed and desired torsional resonance frequency so as to ensure avoidance of such a situation and reduction of unwanted vibrations in the driven unit 10.

Figure 5A:
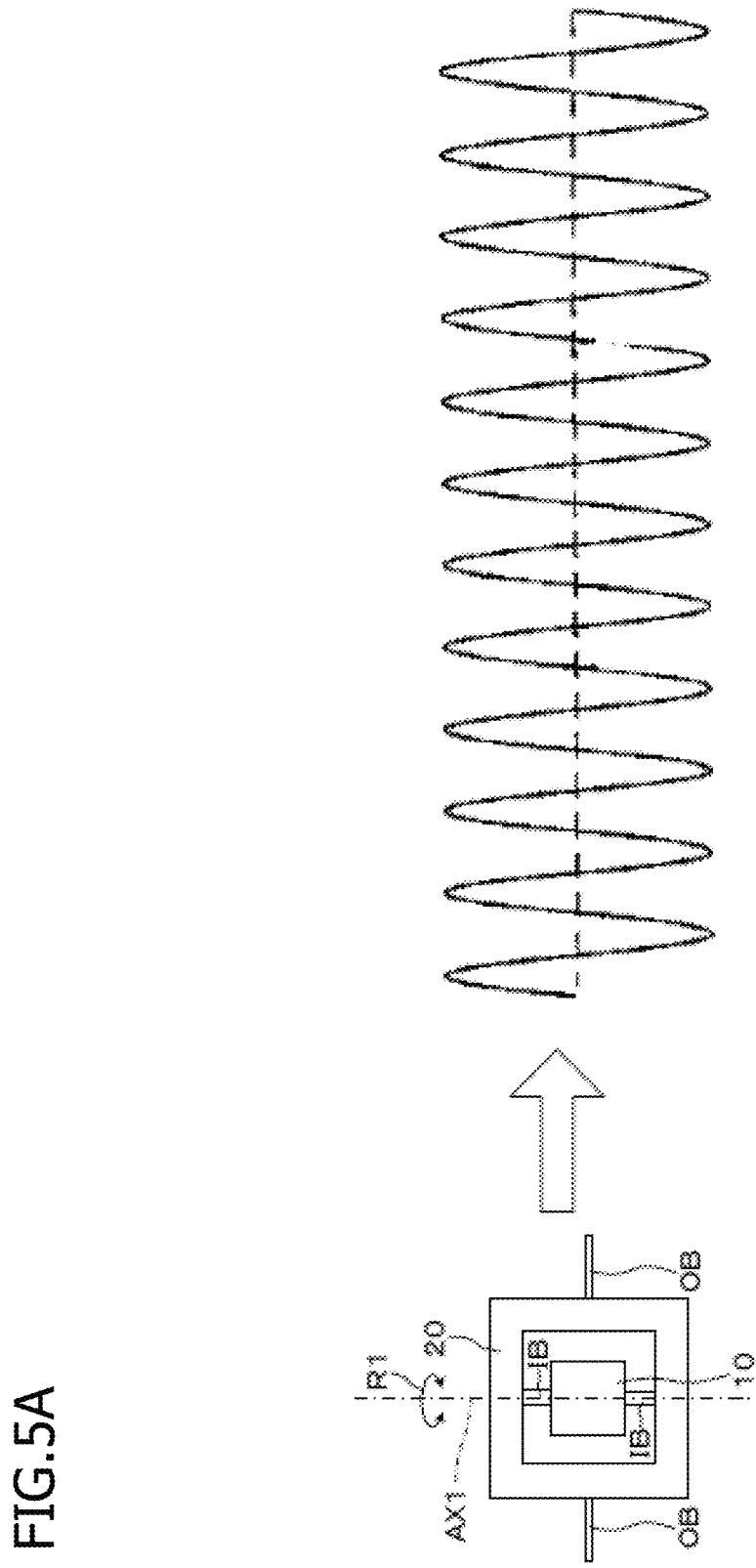
FIG. 5A is a diagram for illustrating an example of drive control by an inner axis driver unit for high-speed axis drive.
Figure 5B:
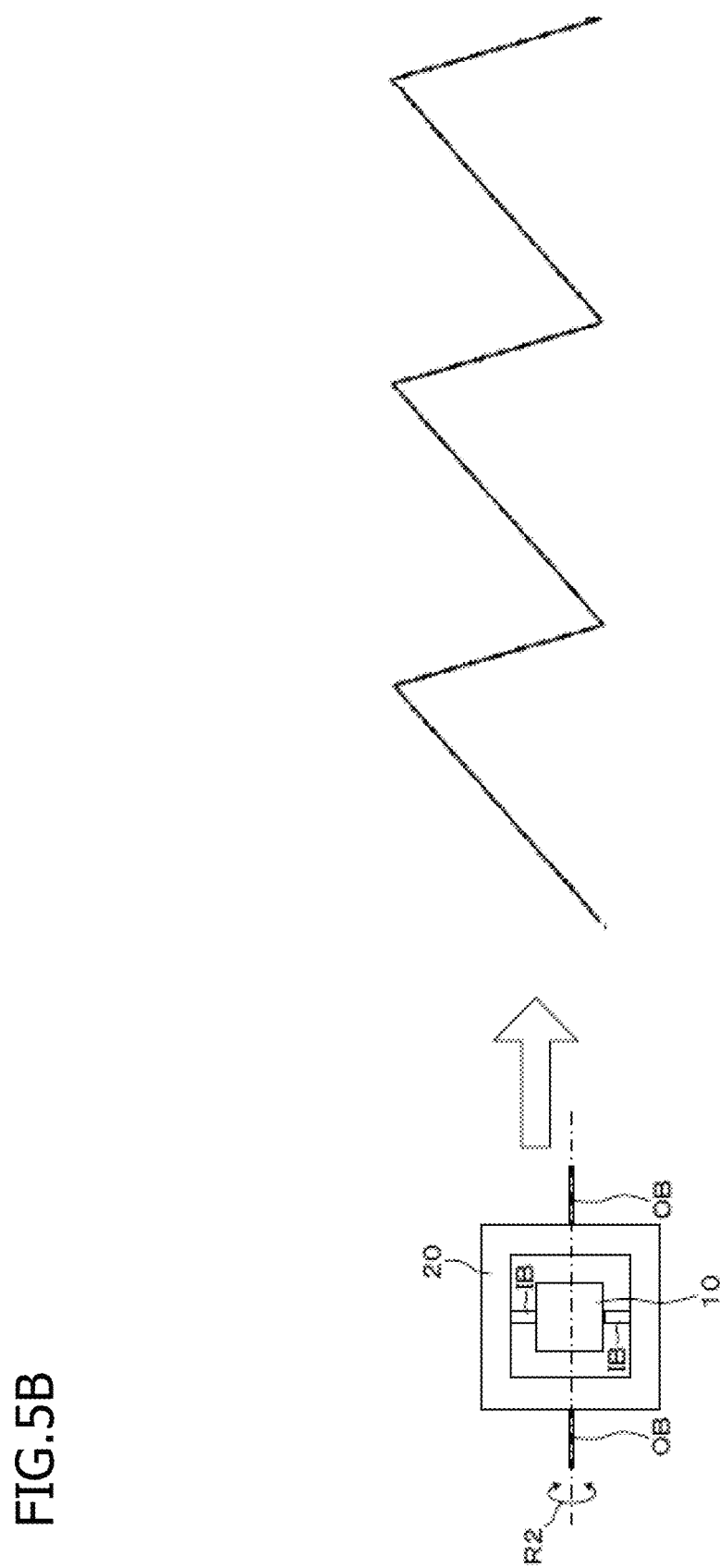
FIG. 5B is a diagram for illustrating an example of drive control by outer axis driver units for low-speed axis drive.

Hereinafter, an example of a scanning operation of the actuator 100 according to the first embodiment will be described with reference to FIG. 5. The actuator 100 according to this embodiment provides biaxial drive using the inner axis driver unit ID for high-speed axis drive and the outer axis driver units DSa, DSb for low-speed axis drive so as to cause the driven unit 10 to perform raster scanning. In other words, in the raster scanning according to this embodiment, the main scanning direction (horizontal direction) is parallel to the high-speed axis and the sub-scanning direction (vertical direction) is parallel to the low-speed axis. FIG. 5A is a diagram for illustrating an example of drive control by the inner axis driver unit ID for high-speed axis drive. FIG. 5B is a diagram for illustrating an example of drive control by the outer axis driver units DSa, DSb for low-speed axis drive. As indicated by the waveforms of the drive waves shown in FIGS. 5A and 5B, the resonant, high-speed axis drive is sine wave drive and the non-resonant (forced), low-speed axis drive is sawtooth wave drive, in this example. According to this embodiment, the above configuration ensures stable raster scanning operation.

Figure 6A:
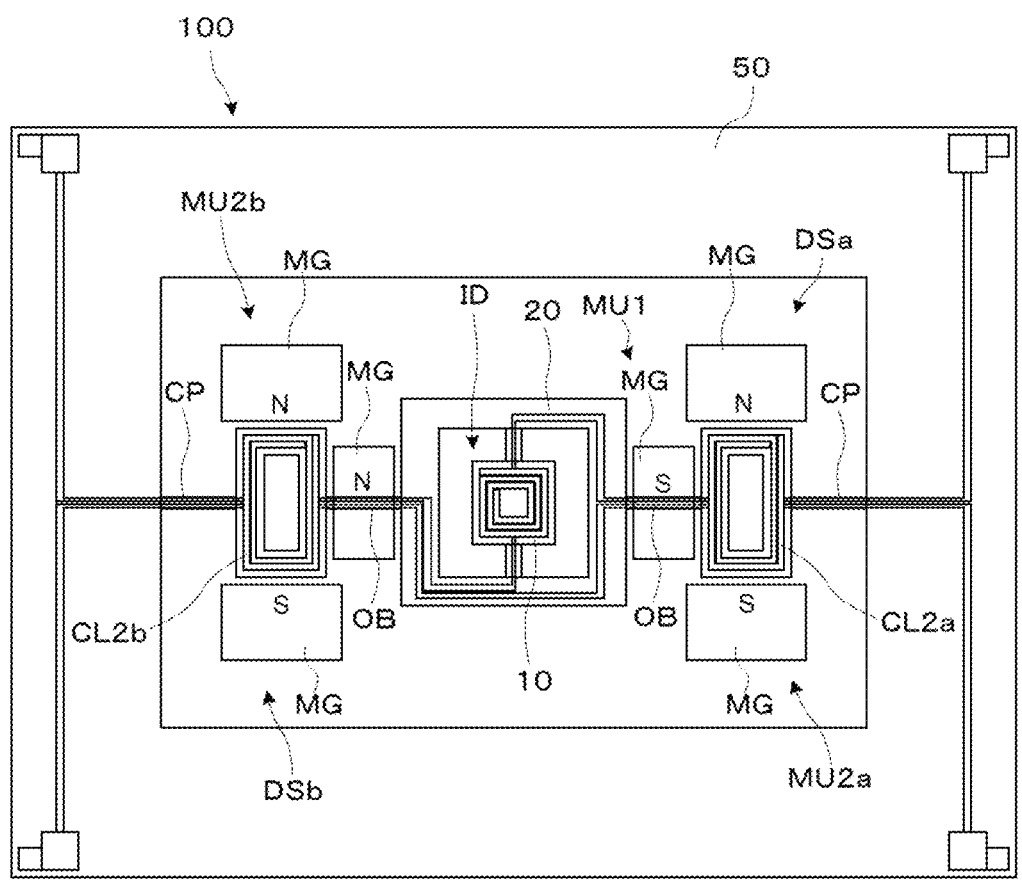
FIG. 6A is a diagram for illustrating magnetic field applying units (magnetic circuits).
Figure 6B:
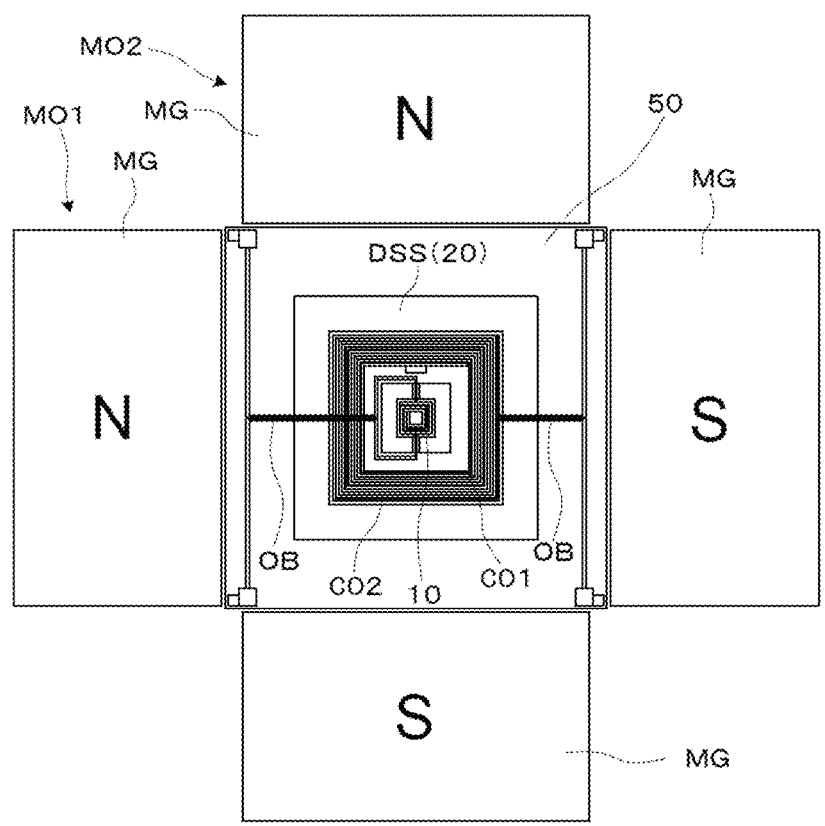
FIG. 6B is a diagram showing a comparative example.

Hereinafter, with reference to FIGS. 6A and 6B, another feature of the above configuration will be described in comparison with a conventional example. Specifically, differences in the configuration of the magnetic field applying units (or magnetic circuits) between this embodiment and the conventional example will be described. FIG. 6A is a diagram for illustrating the magnetic field applying units MU1, MU2a, MU2b in the actuator 100 according to this embodiment. FIG. 6B is a diagram showing a comparative example. To facilitate comparison, the magnifications of FIGS. 6A and 6B are adjusted such that the driven units 10 are shown at the same size. Unlike FIG. 3A which does not show the magnetic field applying units MU1, MU2a, MU2b for simplicity, FIG. 6A shows them, and the differences related thereto will be described below. In accordance with FIG. 6A, FIG. 6B shows, magnetic field applying units MO1, MO2 together with the movable components of a conventional actuator. The comparison of FIGS. 6A and 6B shows that the permanent magnets MG. MG, . . . , constituting the magnetic field applying units in this embodiment are clearly smaller in size than conventionally. This is due to the difference in the distance from each permanent magnet MG to the corresponding coil unit, which serves as the driving part. In this embodiment, in place of a single second coil unit, the second coil units CL2a, CL2b are provided as independent separate units. This allows not only for disposing the permanent magnets MG, MG constituting the magnetic field applying units MU2a, MU2b closer to the second coil units CL2a, CL2b, but also for disposing the permanent magnets MG, MG constituting the magnetic field applying unit MU1 closer to the first coil unit CL1. These advantages are provided by separating the second coil units CL2a, CL2b from each other and reducing the size of the support 20. Since the coil-to-magnetic field distances are reduced as compared to the conventional, the permanent magnets MG according to this embodiment are able to each provide a magnetic field with a required strength even though the permanent magnets MG are smaller than conventional ones. Furthermore, the magnetic field applying units according to this embodiment have simpler structures than conventionally. In the example of FIG. 6B, a magnetic field to be applied to the first coil unit CO1, which is disposed at an inner position, is generated by the magnetic field applying unit MO1, and a magnetic field to be applied to the second coil unit CO2, which is disposed outside the first coil unit CO1, is generated by the magnetic field applying unit MO2. To achieve this, the magnetic fields may need to be generated in directions oblique to the plane of the coil units, for example. In contrast, according to this embodiment, the magnetic field applying units MU1, MU2a, MU2b are formed using the permanent magnets arranged in a simple planar configuration. Thus, according to this embodiment, the magnetic field applying units or any magnetic circuits corresponding thereto may be more easily manufactured than conventionally.

As described above, the actuator according to this embodiment includes the support 20 that supports the driven unit 10, and the outer axis driver units DSa, DSb that are separate and independent from the support 20 and configured to rotate the support 20, in place of a conventional outer movable unit that has two functions to support the driven unit and to use the coil therein to rotate itself. This configuration allows providing a sufficient rotational driving force around the outer, second axis AX2 by reducing size and weight of the related rotatable components and thus by reducing rotational moments thereof, and also allows increasing the resonance frequency of the support 20. As such, the actuator according to this embodiment provides a high-performance drive operation such as a raster scanning operation, for example.

Second Embodiment

Hereinafter, an example of an actuator according to a second embodiment will be described with reference to FIG. 7.

Figure 7A:
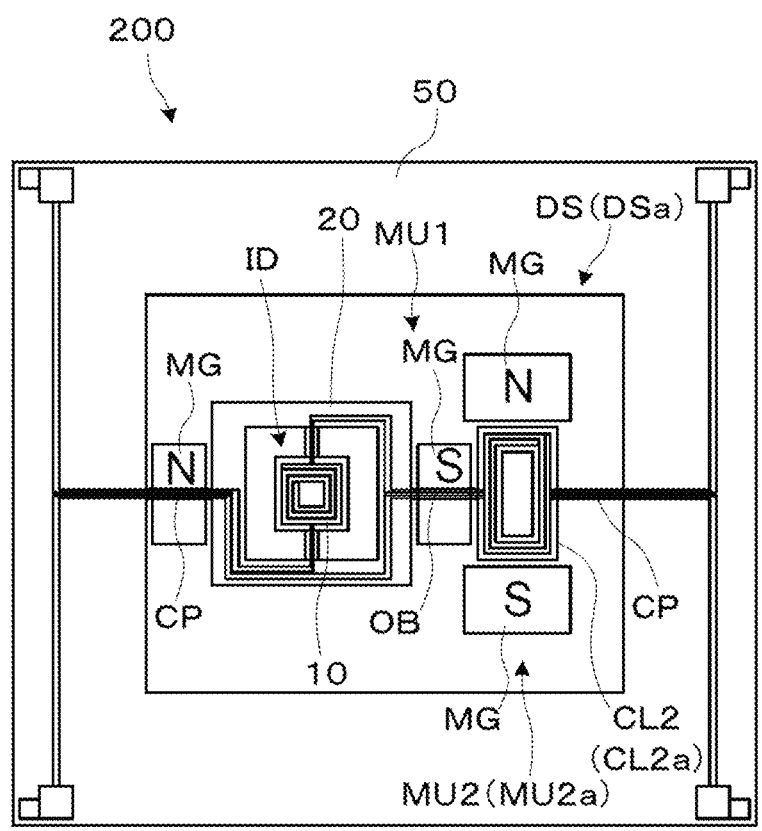
FIG. 7A is a diagram for illustrating an actuator according to a second embodiment.
Figure 7B:
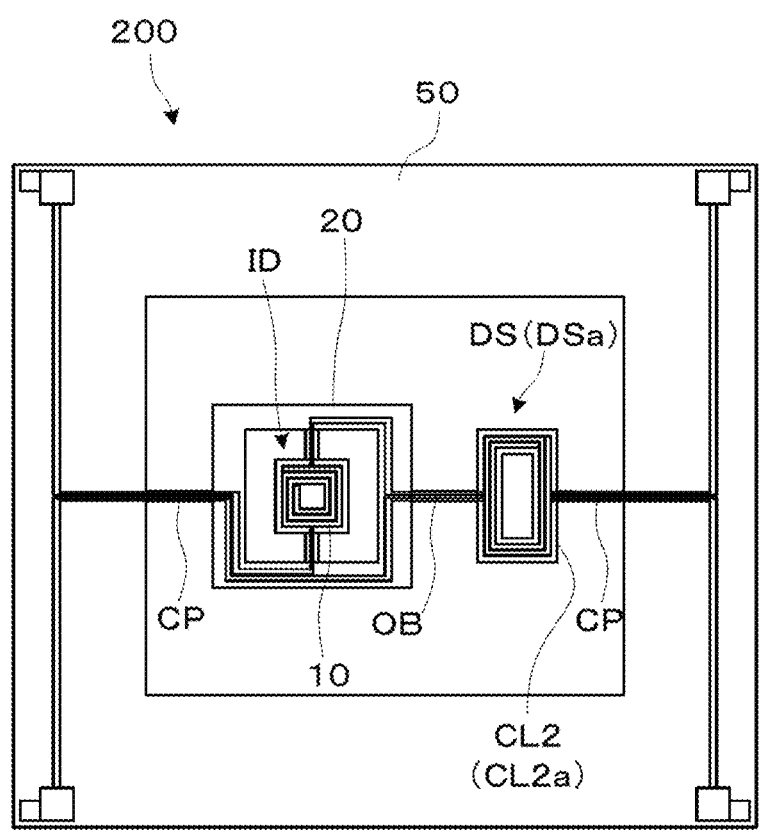
FIG. 7B is a schematic diagram of the actuator, showing only movable components thereof.

FIG. 7A is a diagram for illustrating an actuator 200 according to this embodiment. FIG. 7B is a schematic diagram of the actuator 200, showing only movable components thereof. As shown in FIGS. 7A and 7B, the actuator 200 according to this embodiment is a modification of the actuator 100 according to the first embodiment, and includes the same components as the actuator 100, except for the outer axis driver unit. Thus, the same reference numerals are given to the same components as those in the first embodiment, and detailed description thereof will be omitted below.

As shown in FIGS. 7A and 7B, the actuator 200 according to this embodiment includes a single outer axis driver unit DS, and differs in this regard from the actuator 100 exemplified in the aforementioned drawings including FIG. 1, which includes a pair of first and second outer axis driver units DSa, DSb disposed at separate positions in the right-left direction of the drawings. That is, the actuator 200 includes an outer axis driver unit DS including a second coil unit CL2 and a second magnetic field applying unit MU2, which corresponds to the outer axis driver unit DSa including the second coil unit CL2a and the second magnetic field applying unit MU2a of FIG. 1. As compared to the configuration including the pair of outer axis driver units, the configuration according to the second embodiment provides a reduced outer axis driving force but may be manufactured with reduced size and cost. Thus, when a single outer axis driver unit alone is sufficient to provide a required rotational force, an actuator may have a configuration as in this embodiment so as to be more compact and manufactured with reduced cost.

As described above, the actuator according to this embodiment includes the support 20 that supports the driven unit 10, and the outer axis driver unit DS that is separate and independent from the support 20 and configured to rotate the support 20. This configuration also allows providing a sufficient rotational driving force around the outer, second axis AX2 by reducing size and weight of the related rotatable components, and thus, by reducing rotational moments thereof, and also allows increasing the resonance frequency of the support 20. As such, the actuator according to this embodiment provides a high-performance drive operation such as a raster scanning operation, for example.

Other Embodiments

The present invention is not limited to the above embodiments. Rather, the present invention may be implemented in various different forms without departing from the spirit of the present invention.

First, although the actuator includes one or two outer axis driver units in the above embodiments, the actuator may include three or more outer axis driver units arranged side by side along the second axis AX2 in some embodiments, for example.

Furthermore, although the support 20 is assumed to have a rectangular shape in the above embodiments, the support 20 may have any shape as long as it provides the required functions such as to support the driven unit 10 and to secure a space for accommodating the coil unit and other wiring components. Here, as described above, unlike the conventional outer axis driver unit DSS, the support 20 is not required to receive a current flow that induces a Lorentz force acting on the support 20, and thus, the shape of the support 20 is not limited by such functionality. Thus, with a higher shape degree of freedom than conventionally, the support 20 may have any of a wider variety of shapes. From the viewpoint of increasing the resonance frequency of the support 20 while allowing the actuator to provide a sufficient rotational driving force around the outer, second axis AX2 by reducing size and weight of the related rotatable components, and thus, by reducing rotational moments thereof, the support 20 may have a diamond shape with sides extending diagonally from the ends of the outer beams OB, OB, for example. Furthermore, the support 20 does not need to have a frame shape, and may have one or more cutouts in portions where no wiring is routed, for example.

Furthermore, the control of currents and the directions of the magnetic fields as well as the shapes and arrangements of related components in the above embodiments are merely illustrative, and may be appropriately modified as necessary.

Furthermore, although the first axis AX1 and the second axis AX2 intersect perpendicularly in the above description, biaxial drive is possible as long as these axes are arranged in mutually different directions. As such, the first axis AX1 and the second axis AX2 may extend in directions other than perpendicular to each other depending on the required configuration and intended usage of the actuator.

Furthermore, although the above description uses an example in which the high-speed axis drive is a sine wave drive and the low-speed axis drive is a sawtooth wave drive, this is merely illustrative. The high-speed axis drive and the low-speed axis drive may be performed using any drive waveforms of sawtooth waves, sine waves, and triangle waves.

Although it has been described that the actuator is suitable for raster scanning according to the above embodiments it is obvious that the actuator according to the present invention may be applicable to a Lissajous scanning drive.

REFERENCE SYMBOL LIST

10 Driven unit
20 Support
50 Fixing unit
100 Actuator
200 Actuator
A1 Arrow
AX1 First axis
AX2 Second axis
B1, B2 Magnetic field
C1 Curve
CL1 First coil unit
CL2, CL2a, CL2b Second coil unit
CO1, CO2 Coil unit
CP Connecting member
DS Outer axis driver unit DSS Outer axis driver unit
DSa, DSb Outer axis driver unit
I1, I2 Control current
IB Inner beam
ID Inner axis driver unit
MG Permanent magnet
MO1, MO2 Magnetic field applying unit
MU1 First magnetic field applying unit
MU2, MU2a, MU2b Second magnetic field applying unit
OB Outer beam
R1 Arrow
R2 Arrow

The invention claimed is:

1. An actuator comprising:
a support that supports a driven unit disposed at an inner position of the support by connecting to the driven unit via an inner beam extending along a first axis;
an outer axis driver unit provided separate from the support and connected to the support via an outer beam extending along a second axis perpendicular to the first axis, the outer axis driver unit being configured to rotate the support around the second axis; and
an inner axis driver unit configured to rotate the driven unit around the first axis,
wherein the inner axis driver unit includes a first coil unit formed on the driven unit and configured to rotate around the first axis, and a first magnetic field applying unit including a pair of permanent magnets that is configured to generate a magnetic field in a single direction so as to apply, to the first coil unit, a rotational force that rotates the first coil unit around the first axis,
wherein the outer axis driver unit includes a second coil unit configured to rotate around the second axis, and a second magnetic field applying unit configured to generate a magnetic field in a single direction so as to apply, to the second coil unit, a rotational force that rotates the second coil unit around the second axis, and
wherein the first coil unit and the support are sandwiched between the pair of permanent magnets.

2. The actuator according to claim 1,
wherein the outer axis driver unit is a low-speed axis driver unit,
wherein the inner axis driver unit is a high-speed axis driver unit, and
wherein the outer axis driver unit and the inner axis driver unit are configured to provide biaxial drive that causes the driven unit to perform raster scanning.

3. The actuator according to claim 1, wherein a plurality of the outer axis driver units are provided.

4. The actuator according to claim 3, wherein the outer axis driver units are a pair of the outer axis driver units disposed at opposite ends of the support along the second axis.

5. The actuator according to claim 1, wherein a natural frequency of the support is higher than a torsional resonance frequency of the driven unit.

* * * * *